(12) United States Patent
Savic et al.

(10) Patent No.: US 9,414,497 B2
(45) Date of Patent: Aug. 9, 2016

(54) SEMICONDUCTOR PACKAGE INCLUDING AN EMBEDDED CIRCUIT COMPONENT WITHIN A SUPPORT STRUCTURE OF THE PACKAGE

(71) Applicant: Cisco Technology, Inc., San Jose, CA (US)

(72) Inventors: Jovica Savic, Santa Clara, CA (US); Zhiping Yang, Cupertino, CA (US); Jie Xue, San Ramon, CA (US); Li Li, San Ramon, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 14/815,184

(22) Filed: Jul. 31, 2015

(65) Prior Publication Data

US 2015/0342053 A1    Nov. 26, 2015

Related U.S. Application Data

(62) Division of application No. 13/296,707, filed on Nov. 15, 2011, now Pat. No. 9,129,908.

(51) Int. Cl.
| | |
|---|---|
| *H01L 29/06* | (2006.01) |
| *H05K 1/18* | (2006.01) |
| *H01L 23/498* | (2006.01) |
| *H05K 1/11* | (2006.01) |

(Continued)

(52) U.S. Cl.
CPC ............... *H05K 1/183* (2013.01); *H01L 23/24* (2013.01); *H01L 23/3107* (2013.01); *H01L 23/49838* (2013.01); *H05K 1/115* (2013.01); *H05K 1/181* (2013.01); *H01L 2224/16225* (2013.01); *H01L 2924/0002* (2013.01); *H05K 2201/095* (2013.01); *H05K 2201/10492* (2013.01); *H05K 2201/10507* (2013.01)

(58) Field of Classification Search
CPC ........... H01L 2224/16225; H01L 2224/73265; H01L 2924/15311; H01L 23/49822
See application file for complete search history.

(56) References Cited

U.S. PATENT DOCUMENTS

| | | | |
|---|---|---|---|
| 6,388,207 B1 * | 5/2002 | Figueroa | H01L 23/49805 174/261 |
| 7,570,493 B2 | 8/2009 | Karlsson | |
| 7,737,818 B2 | 6/2010 | Djordjevic et al. | |

(Continued)

OTHER PUBLICATIONS

International Search Report and Written Opinion in counterpart International Application No. PCT/US2012/046039, mailed Sep. 19, 2012.

(Continued)

*Primary Examiner* — Zandra Smith
*Assistant Examiner* — John M Parker
(74) *Attorney, Agent, or Firm* — Edell, Shapiro & Finnan, LLC

(57) ABSTRACT

An apparatus includes a cavity formed in a support structure, the support structure being operable to support a semiconductor device. A circuit element is disposed in the cavity in the support structure, and the cavity in the support structure is filled with an electrically non-conductive filling material so as to at least partially surround the circuit element with the non-conductive filling material. The semiconductor device is electrically connected to the circuit element. In an example embodiment, the circuit element is operable to substantially block direct current that is output by the semiconductor device or another semiconductor device.

16 Claims, 18 Drawing Sheets

(51) Int. Cl.
*H01L 23/24* (2006.01)
*H01L 23/31* (2006.01)

(56) References Cited

U.S. PATENT DOCUMENTS

| | | |
|---|---|---|
| 2003/0087498 A1 | 5/2003 | Galvagni |
| 2005/0016763 A1 | 1/2005 | Zollo et al. |
| 2006/0118931 A1 | 6/2006 | Ho et al. |
| 2006/0154496 A1 | 7/2006 | Imamura et al. |
| 2007/0013068 A1 | 1/2007 | Ranade et al. |
| 2007/0278000 A1 | 12/2007 | Suzuki et al. |
| 2007/0287281 A1 | 12/2007 | Wang et al. |
| 2008/0079118 A1 | 4/2008 | Bang et al. |
| 2009/0170241 A1 | 7/2009 | Shim et al. |
| 2009/0250249 A1 | 10/2009 | Racz et al. |
| 2010/0027225 A1 | 2/2010 | Yuda et al. |
| 2010/0112826 A1 | 5/2010 | Frasco |
| 2010/0246149 A1 | 9/2010 | Nakashima et al. |

OTHER PUBLICATIONS

English translation of Office Action in Chinese Application No. 201280044452.9, mailed Jan. 21, 2016, 17 pages.

* cited by examiner

SEMICONDUCTOR PACKAGE INCLUDING AN EMBEDDED CIRCUIT COMPONENT WITHIN A SUPPORT STRUCTURE OF THE PACKAGE

CROSS-REFERENCE TO RELATED APPLICATION

This application is a divisional of U.S. patent application Ser. No. 13/296,707, filed Nov. 15, 2011, the entirety of which is incorporated herein by reference.

TECHNICAL FIELD

The present disclosure relates to manufacturing a semiconductor package including an external circuit element.

BACKGROUND

High-speed serial links may be used to transfer data signals between two or more (e.g., two) electrical components (e.g., semiconductor devices) such as, for example, application-specific integrated circuits (ASICs). The transferred data signals may be direct current-balanced (DC-balanced) signals to avoid voltage imbalance problems between the connected semiconductor devices (e.g., the semiconductor devices may have different DC voltage levels). In order to isolate DC bias voltages of the two semiconductor devices, DC blocking capacitors may be electrically connected to the semiconductor devices, between the semiconductor devices. Using the DC blocking capacitors, the alternating current (AC) portion of the transferred data signals may pass through while the DC portion of the transferred data signals may be blocked.

DESCRIPTION OF EXAMPLE EMBODIMENTS

Overview

A method for manufacturing a semiconductor package is provided. The method comprises forming a cavity in a support structure, the support structure operable to support a semiconductor device, disposing at least a portion of a circuit element in the cavity in the support structure, filling the cavity in the support structure with an electrically non-conductive filling material so as to at least partially surround the circuit element with the non-conductive filling material, and electrically connecting the semiconductor device to the circuit element.

In another embodiment, an apparatus is formed by the previously described method. In an example embodiment of the apparatus, the circuit element is operable to substantially block direct current that is output by the semiconductor device or another semiconductor device.

Example Embodiments

Circuit elements that are operable to block or substantially block direct current (DC), such as DC blocking capacitors used in high-speed serial links, may be placed vertically inside of non-plated or plated through holes of a semiconductor package substrate, an interposer, or a printed circuit board (PCB). The non-plated or plated through holes have already been formed as part of the through hole formation process, so no further processing is required to form a through hole for the DC blocking capacitors (i.e., an already existing through hole can be used). Further, additional space is not used on the PCB to electrically connect the DC blocking capacitors to other devices, and no extra discontinuity or crosstalk is added in the high-speed signal.

In order to decrease the amount of board space used, circuit elements such as DC blocking capacitors used in a serial communication link between two or more electrical components are disposed in already existing openings in a support structure (e.g., a substrate) that supports at least one of the two electrical components. The openings are otherwise plated and used for signal transmission from the one electrical component to a PCB supporting the substrate. The DC blocking capacitors may be oriented substantially vertically, and a non-conducting material may be disposed in each opening in the substrate such that the non-conducting material at least partially surrounds and fixes the orientation of the DC blocking capacitor disposed in the opening. The number of vias associated with decoupling/coupling circuits in the PCB is decreased, thus also decreasing discontinuities and cross-talk in the serial communication link.

Figure 1:
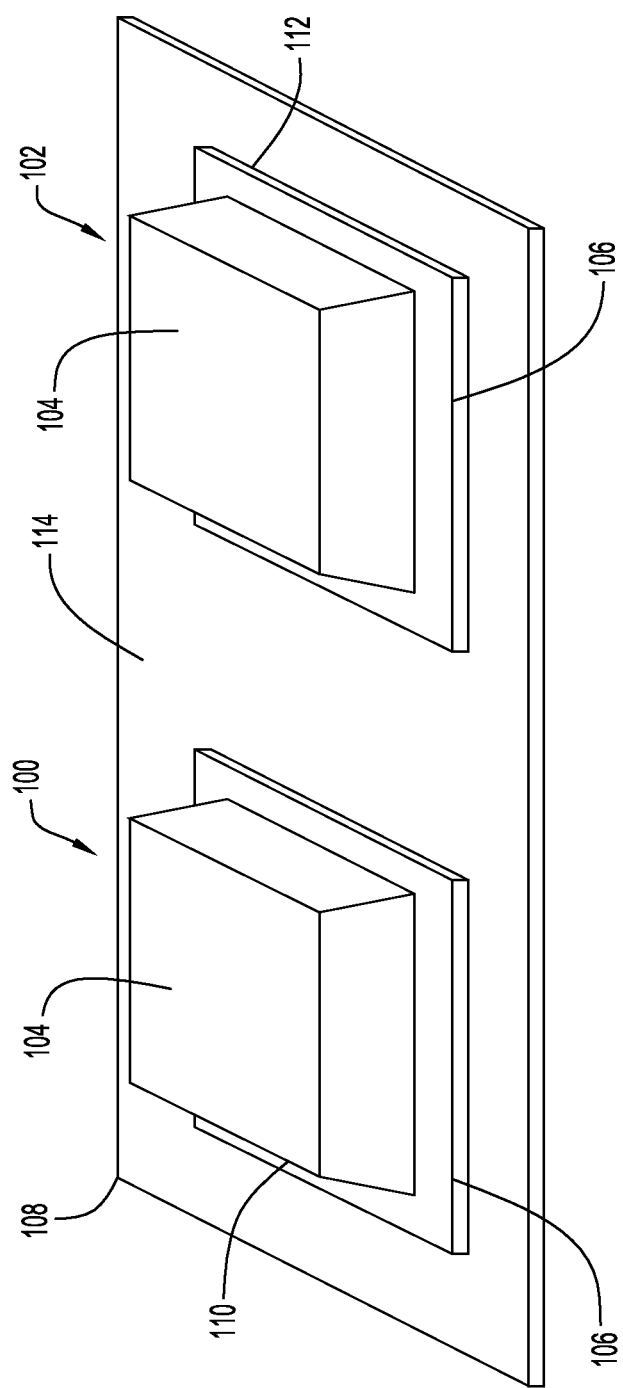
FIG. 1 is a perspective view of an example embodiment of a computer system including two electrically connected semiconductor packages.

Referring to FIG. 1, a perspective view is shown of an example embodiment of a computer system including a first electrical component 100 (e.g., a first semiconductor package) and a second electrical component 102 (e.g., a second semiconductor package). Each of the first and second semiconductor packages 100 and 102 includes a molded casing 104, in which a semiconductor device (shown in FIGS. 2 and 3) is embedded. The semiconductor devices may be application-specific integrated circuits (ASICs), microprocessors, DRAM, flash memory, other devices or a combination thereof. The molded casings 104 are made of any number of materials including, for example, an epoxy-based resin material and can also have any shape. In one embodiment, the first semiconductor package 100 and/or the second semiconductor package 102 may not include the molded casings 104. The first and second semiconductor packages 100 and 102 may include a metal lid above the respective semiconductor devices.

The first and second semiconductor packages 100 and 102 each include a substrate 106 that supports the respective semiconductor device and the molded casing 104. The first and second semiconductor packages 100 and 102 may or may not be supported by and electrically connected to a printed circuit board (PCB) 108 (e.g., the first semiconductor package 100 may be supported by another semiconductor package or an interposer). The substrates 106 each include a first surface 110 (e.g., a top surface) and a second surface 112 (e.g., a bottom surface). The first surface 110 of each substrate 106 may support and be electrically connected to the respective semiconductor device, while a first surface 114 (e.g., a top surface) of the PCB 108 may support and be electrically connected to the second surfaces 112 of the substrates 106.

The substrates 106 may be organic substrates 106 (e.g., the substrate can be made from a polymeric material) such as, for example, bismaleimide triazine-based (BT-based) substrates 106. Other substrates, such as, for example, insulated metal substrates and ceramic substrates, may also be used for the substrates 106. In one embodiment, the first semiconductor package 100 and/or the second semiconductor package 102 do not include the substrate 106 and are directly attached to the PCB 108. In another embodiment, the first semiconductor package 100 and the second semiconductor package 102 are supported by different PCBs. The first semiconductor package 100 and the second semiconductor package 102 may be located in different computer systems.

Figure 2:
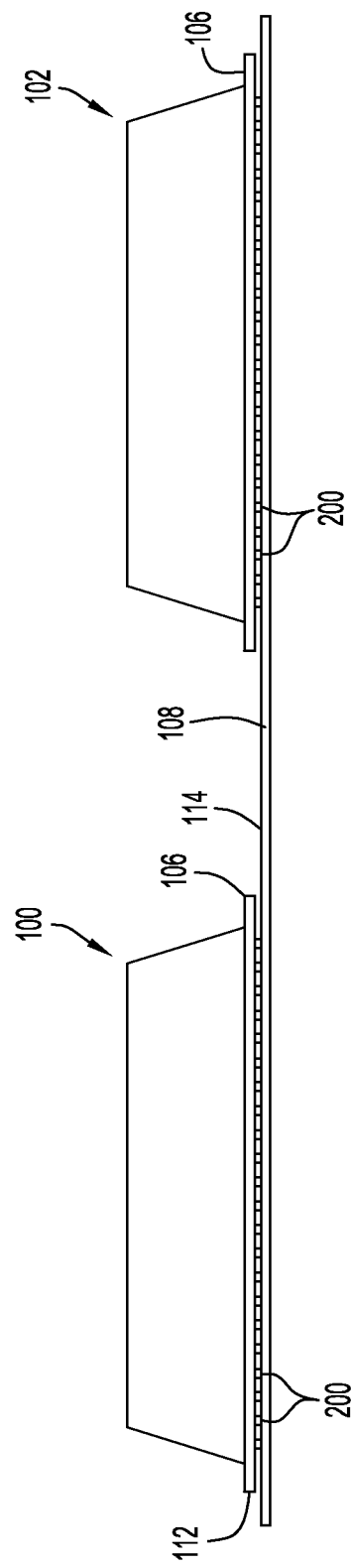
FIG. 2 is a front view of an example embodiment of the computer system of FIG. 1.

A front view of the computer system of FIG. 1 is shown in FIG. 2, with each of the first and second semiconductor packages 100 and 102 including a ball grid array. The bottom surface 112 of each substrate 106 may be attached to the top surface 114 of the PCB 108. The bottom surface 112 of each substrate 106 includes an array of solder balls 200 (e.g., a ball grid array (BGA)) used to conduct electrical signals from the first or second semiconductor package 100 or 102 to the PCB 108. Each BGA 200 is attached to corresponding contact pads on the PCB 108 using, for example, reflow soldering. Other arrangements of conductive materials including, without limitation, an array of conductive pins, may be provided on the bottom surface 112 of each substrate 106 to conduct electrical signals to and/or from the first and second semiconductor packages 100 and 102 from and/or to the PCB 108. The PCB 108 may include internal or external conductive routing layers (not shown) that electrically connect the first semiconductor package 100 to the second semiconductor package 102. Alternatively, the first semiconductor package 100 may be electrically connected to the second semiconductor package 102 with traces on one or more external surfaces of the PCB 108.

Figure 3:
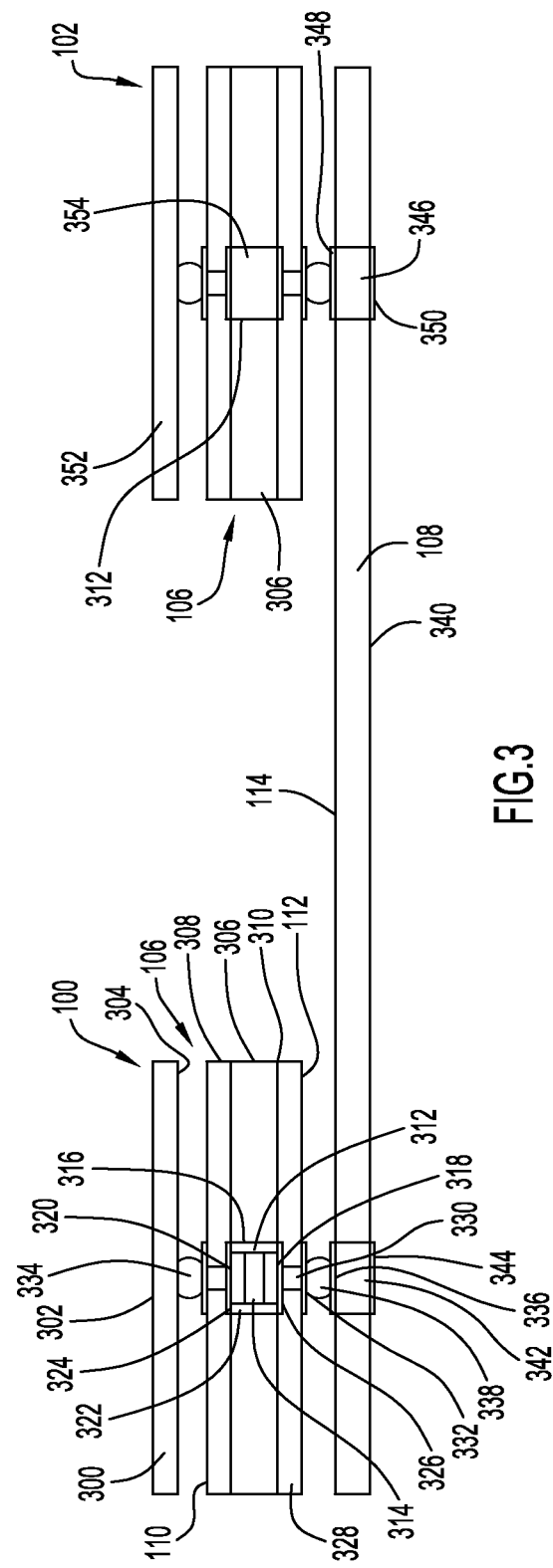
FIG. 3 is a cross-sectional view of an example embodiment of the computer system of FIGS. 1 and 2.

A cross-sectional view of a portion of an example embodiment of the computer system of FIG. 1 is depicted in FIG. 3. The first semiconductor package 100 includes a first semiconductor device 300 and the substrate 106. The molded casing 104 at least partly surrounds the first semiconductor device 300 (shown with the molded casing removed in FIG. 3). The first semiconductor device 300 includes a first side 302 and a second side 304 that may be opposite the first side 302. The first side 302 may be embedded in the molded casing 104, for example. Alternatively, the first side 302 may face the substrate 106. The first side 302 of the first semiconductor device 300 may include a plurality of layers that forms an integrated circuit. In one embodiment, the first side 302 may include a plurality of stacked integrated circuits that are interconnected. The integrated circuit may include any number and combination of electrical components including, for example, transistors, memristors, resistors, capacitors and/or inductors. An outermost layer of the plurality of layers that forms the integrated circuit of the first side 302 may be a passivation layer. The passivation layer may be silicon oxide, for example. The first semiconductor device 300 may be made of any number of semiconductor materials including, for example, silicon, gallium arsenide or silicon carbide. The first semiconductor device 300 may be, for example, an application-specific integrated circuit (ASIC) or a microprocessor.

The first semiconductor device 300 may include a plurality of through vias (not shown) that pass at least partly though the first semiconductor device 300, connecting the integrated circuit of the first side 302 to the second side 304 of the first semiconductor device 300. The through vias may extend in a direction generally perpendicular to the first side 302 and/or the second side 304 of the first semiconductor device 300. "Generally" allows for other angles while still extending in a direction away from the first side 302 and/or the second side 304 of the first semiconductor device 300. The through vias may be filled with any number of electrically conductive materials (e.g., an electrically conductive plating) including, for example, copper. The through vias may be located anywhere on the first semiconductor device 300 including, for example, at the perimeter of the first semiconductor device 300 or internal to the perimeter of the first semiconductor device 300.

The first semiconductor device 300 may also include bonding pads (not shown) deposited on the second side 304 of the first semiconductor device 300. The bonding pads are connected to the electrically conductive plating of the through vias. The bonding pads may be made of a different material than or the same material as the electrically conductive plating of the through vias (e.g., aluminum or copper). The bonding pads may be formed as a single piece with the electrically conductive plating of the through vias. The bonding pads are deposited using electroplating or electroless plating, for example. The bonding pads may also be adhered to the electrically conductive plating of the through vias with solder, for example. In one embodiment, the second side 304 of the first semiconductor device 300 does not include bonding pads, and the first side 302 of the first semiconductor device 300 faces the substrate 106. The first side 302 of the first semiconductor device 300 may be electrically connected to the substrate 106 with solder bumps (e.g., C4 solder bumps), for example.

The substrate 106 of the first semiconductor device 300 includes a substrate core 306. The substrate core 306 includes a first surface 308, a second surface 310, and a plurality of openings 312 (e.g., a plurality of plated or non-plated through holes; one shown in FIG. 3). The substrate core 306 may be a bismaleimide triazine-based (BT-based) substrate core, for example. The substrate core 306 may be any number of shapes including, for example, rectangular. Each opening 312 of the plurality of openings may extend from the first surface 308 to the second surface 310 of the substrate core 306 in a direction generally perpendicular or transverse to the first surface 308 and/or the second surface 310 of the substrate core 306 (e.g., vertically). "Generally perpendicular" allows for perpendicular (i.e., 90°) as well as other angles while still extending in a direction away from the first surface 308 and/or the second surface 310 of the substrate core 306. In an example embodiment, each opening 312 of the plurality of openings is larger at the first surface 308 than at the second surface 310. In another example embodiment, the plurality of openings 312 may extend from the first surface 308 or the second surface 310 of the substrate core 306, at least partly through the substrate core 306. The plurality of openings 312 may be any number of shapes including v-shaped, conical or cylindrical, for example.

A circuit element 314 may be disposed in each opening 312 of the plurality. The circuit element 314 can be any suitable type of electrical circuit element, such as a DC blocking capacitor. However, the circuit element 314 can also be other types of electrical circuit elements including, without limitation, a resistor or an inductor. An opening 312 may be sized and shaped such that at least part of the circuit element 314 abuts a surface 316 that at least partly defines the opening 312 (e.g., a semi-tight fit; the circuit element 314 is not shown abutting the surface 316 in FIG. 3 for clarity). The circuit element 314 may be disposed in the opening 312 such that the surface 316 that at least partly defines the opening 312 at least partly surrounds the circuit element 314. The DC blocking capacitor 314 may be disposed in the opening 312 such that a first end 318 (e.g., an input) of the DC blocking capacitor 314 is adjacent or nearly adjacent to the second surface 310 of the substrate core 306, and a second end 320 (e.g., an output) of the blocking capacitor 314 is adjacent or nearly adjacent to the first surface 308 of the substrate core 306. Electrical signals may flow in one direction through the DC blocking capacitor (e.g., from the first end 318 to the second end 320 or from the second end 320 to the first end 318) or in both directions through the DC blocking capacitor 314 (e.g., from the first end 318 to the second end 320 and from the second end 320 to the first end 318). In one embodiment, the DC blocking capacitor 314 is disposed in the opening 312 such that a longitudinal axis of the DC blocking capacitor 314 (e.g., extending from the input 318 to the output 320 of the DC blocking capacitor 314) is substantially perpendicular to the first surface 308 and/or the second surface 310 of the substrate core 306. Alternatively or additionally, the DC blocking capacitor 314 may be disposed in the opening 312 such that the longitudinal axis of the DC blocking capacitor 314 is substantially parallel to the surface 316 that at least partly defines the opening 312. In other words, the longitudinal axis of the blocking capacitor 314 may extend vertically between the first surface 308 and the second surface 310 of the substrate core 306. In other embodiments, the DC blocking capacitor 314 may be in different orientations relative to the surface 316 (e.g., substantially perpendicular to the surface 316). The DC blocking capacitor 314 may be disposed in the opening 312 to be completely surrounded by the surface 316 such that the DC blocking capacitor 314 does not extend out of the opening 312 beyond the first surface 308 and the second surface 310. Alternatively, the DC blocking capacitor 314 may be disposed in the opening 312 to be partially surrounded by the surface 316 such that a part of the DC blocking capacitor 314 extends out of the opening 312 beyond one or both of the first surface 308 and the second surface 310.

An electrically non-conductive material 322 (e.g., an epoxy) may be disposed in each opening 312 of the plurality to fix the orientation of the DC blocking capacitor 314 (or other electrical circuit element) relative to the surface 316. The epoxy 322 may be disposed in the opening 312 such that the epoxy 322 at least partially surrounds the DC blocking capacitor 314. In one embodiment, the epoxy 322 may be applied (e.g., laminated) to the first surface 308 and the second surface 310 of the substrate core 306 and allowed to flow into the plurality of openings 312. Openings (e.g., micro vias; not shown) may be formed (e.g., drilled) in the epoxy 322 disposed on the first surface 308 and the second surface 310 of the substrate core 306, adjacent to the input 318 and the output 320 of the DC blocking capacitor 314. The micro vias in the epoxy 322 may be filled with any number of electrically conductive materials (e.g., an electrically conductive plating) including, for example, copper.

A first layer of electrically conductive material 324 (e.g., a first layer of copper) may be disposed (e.g., plated) on or adjacent to the first surface 308 of the substrate core 306, and a second layer of electrically conductive material 326 (e.g., a second layer of copper) may be disposed (e.g., plated) on or adjacent to the second surface 310 of the substrate core 306. The first layer of conductive material 324 and the second layer of conductive material 326 may be any number of electrically conductive materials including, for example, aluminum or copper. The first layer of copper 324 and the second layer of copper 326 may be etched to form a circuit (e.g., traces).

Insulating layers 328 may be disposed (e.g., laminated) on or adjacent to the first surface 308 and/or the second surface 310 of the substrate core 306. The insulating layers 328 may be any number of dielectric materials including, for example, glass reinforced epoxy. The insulating layers 328 may be attached (e.g., laminated) to the substrate core 306 and/or each other using an epoxy, for example. The insulating layers 328 may include vias 330 filled (e.g., plated) with the same or a different electrically conducting material than the first and second layers of electrically conducting material 324 and 326 (e.g., copper).

The substrate 106 may also include one or more additional layers of electrically conductive material (e.g., additional layers of copper) that abut or are adjacent to at least one insulating layer 328. The additional layers of copper may be etched to form additional circuits (e.g., traces) within or on the substrate 106.

The first surface 110 and the second surface 112 of the substrate 106 may include bonding pads 332 that abut the copper plated vias 330. The bonding pads 332 may be made of a different or the same material as the plating of the vias 330 (e.g., aluminum or copper). The bonding pads 332 may be formed as a single piece with the plating of the vias 330. The bonding pads 332 may be deposited using electroplating or electroless plating, for example. The bonding pads 332 may also be adhered to the plating of the vias 330 with solder, for example.

The bonding pads on the second side 304 of the first semiconductor device 300 may be attached to the bonding pads 332 on the first surface 110 of the substrate 106 using an array of solder balls 334 (e.g., a ball grid array (BGA)) attached to the second side 304 of the first semiconductor device 300, for example. Other arrangements of conductive materials such as, for example, an array of conductive pins may be provided on the second side 304 of the first semiconductor device 300 to conduct electrical signals to and/or from the first semiconductor device. The BGA 334 may be attached to the bonding pads 332 on the first surface 110 of the substrate 106 using reflow soldering, for example. The BGA 334 may be used to conduct electrical signals from the substrate 106 to the first semiconductor device 300 and/or from the first semiconductor device 300 to the substrate 106.

The bonding pads 332 on the second surface 112 of the substrate 106 may be attached to bonding pads 336 on the top surface 114 of the PCB 108 using an array of solder balls 338 (e.g., a ball grid array (BGA); the BGA 338 may be the same or different than the BGA 200 shown in FIG. 2) attached to the second surface 112 of the substrate 106, for example. The BGA 338 may be attached to the bonding pads 336 on the top surface 114 of the PCB 108 using reflow soldering, for example. The BGA 338 may be used to conduct electrical signals from the PCB 108 to the substrate 106 of the first semiconductor package 100 and/or from the substrate 106 of the first semiconductor package 100 to the PCB 108.

The PCB 108 may include the first surface 114 and a second surface 340. The PCB 108 may include a first plurality of vias 342 (one shown) filled (e.g., plated) with an electrically conducting material such as, for example, copper. Each via of the first plurality of vias 342 may extend from the first surface 114 to the second surface 340 of the PCB 108. The bonding pads 336 on the top surface 114 of the PCB 108 may abut corresponding vias of the plurality of copper plated vias 342. Alternatively, the PCB 108 may not include the bonding pads 336, and the BGA 338 may be attached directly to the first plurality of copper plated vias 342. The PCB 108 may also include bonding pads 344 on the second surface 340 of the PCB 108. The bonding pads 344 may also abut the first plurality of copper plated vias 342. The bonding pads 344 may be made of a different or the same material as the plating of the first plurality of vias 342 (e.g., aluminum or copper).

The PCB 108 may include one or more layers of electrically conducting material (e.g., copper; not shown) on the first surface 114 of the PCB 108, the second surface 340 of the PCB 108, and/or within the PCB. The one or more layers of copper may be etched to form circuits (e.g., traces) on and/or in the PCB 108. The one or more layers of copper on and/or in the PCB 108 may electrically connect the first semiconductor package 100 to the second semiconductor package 102 via a second plurality of vias 346 (one shown) filled (e.g., plated) with an electrically conducting material such as, for example, copper. Each via of the second plurality of vias 346 may extend from the first surface 114 to the second surface 340 of the PCB 108. The PCB 108 may include bonding pads 348 on the first surface 114 and bonding pads 350 on the second surface 340 of the PCB 108; the bonding pads 348 on the first surface 114 and the bonding pads 350 on the second surface 340 may abut corresponding vias of the second plurality of copper plated vias 346.

The second semiconductor package 102 includes a second semiconductor device 352 and the substrate 106. The second semiconductor device 352 may be attached and electrically connected to the substrate 106 in the same or a similar way as discussed above for the first semiconductor package 100. Also, the second semiconductor package 102 may be attached and electrically connected to the PCB 108 in the same or a similar way as discussed above for the first semiconductor package 100. In other embodiments, the second semiconductor package 102 may include different components and/or more or fewer components than the first semiconductor package 100.

Except for the plurality of openings 312, the substrate 106 of the second semiconductor package 102 may be configured in the same or a similar way as discussed above for the first semiconductor package 100. The plurality of openings 312 in the substrate 106 of the second semiconductor package 102 may be filled (e.g., plated) with an electrically conductive material 354 (e.g., copper plating) to transmit signals from the second semiconductor device 352 to the first semiconductor device 300 and/or from the first semiconductor device 300 to the second semiconductor device 352. The substrates 106 of the first and second semiconductor package 100 may be the same or different shapes, sizes and/or materials.

In other embodiments, the second semiconductor package 102 includes more or fewer openings 312, more or fewer insulating layers 328 disposed on or adjacent the substrate core 306 and/or more or fewer layers of electrically conducting material than the first semiconductor package 100. The first electrical component 100 and/or the second electrical component 102 may not be semiconductor packages. The first electrical component 100 and the second electrical component 102 may be any number of electrical components including, but not limited to, an integrated circuit, such as a field programmable gate array (FPGA), an application specific integrated circuit (ASIC), or a radio frequency (RF) integrated circuit, a power supply, a memory device, a controller, digital logic, one or more transistors, or one or more diodes.

Semiconductor packages may include the same number, or different numbers, of openings in a substrate supporting a semiconductor device as the number of openings 312 in the present embodiments (e.g., two openings for each differential pair). In some examples, the openings may be plated with a conductive material (e.g., copper) and used to transmit signals from the semiconductor device to and/or from the PCB. Accordingly, the semiconductor packages 100 of the present embodiments may utilize already existing through-holes to house the DC blocking capacitors 314. By utilizing already existing through-holes, bonding pads and vias used to electrically connect the DC blocking capacitors to signal traces within the PCB may not be needed. Also, PCB space used for the DC blocking capacitors may not be needed; this may increase the density of the semiconductor packages of the present embodiments and reduce the size and cost of the PCB 108 in the computer system.

In some configurations, the vias and bond pads in and on the PCB used to electrically connect the DC blocking capacitors to the signal traces within the PCB may cause cross-talk and signal reflection (e.g., noise) within a serial link between two electrical components (e.g., two semiconductor packages). By positioning the DC blocking capacitors 314 within the already existing plurality of openings 312 in the substrate 106, cross-talk and signal reflections may be reduced, thus increasing high-speed serial link performance.

Positioning the DC blocking capacitors 314 in the plurality of openings 312 such that the longitudinal axes of the DC blocking capacitors 314 are generally parallel to the surfaces 316 that at least partly define the plurality of openings 312 may minimize the length of the signal path from the first semiconductor device 300 to the PCB 108. This may also reduce the impedance between the first semiconductor device 300 and the PCB 108 and thus, reduce the parasitic losses between the first semiconductor device 300 and the PCB 108. By positioning the DC blocking capacitors 314 in the already existing plurality of openings 312 in the substrate 106, the DC blocking capacitors 314 may not take up additional board space on or in the substrate 106 and may not affect the positioning of signal traces and other components within the substrate 106.

Figure 4:
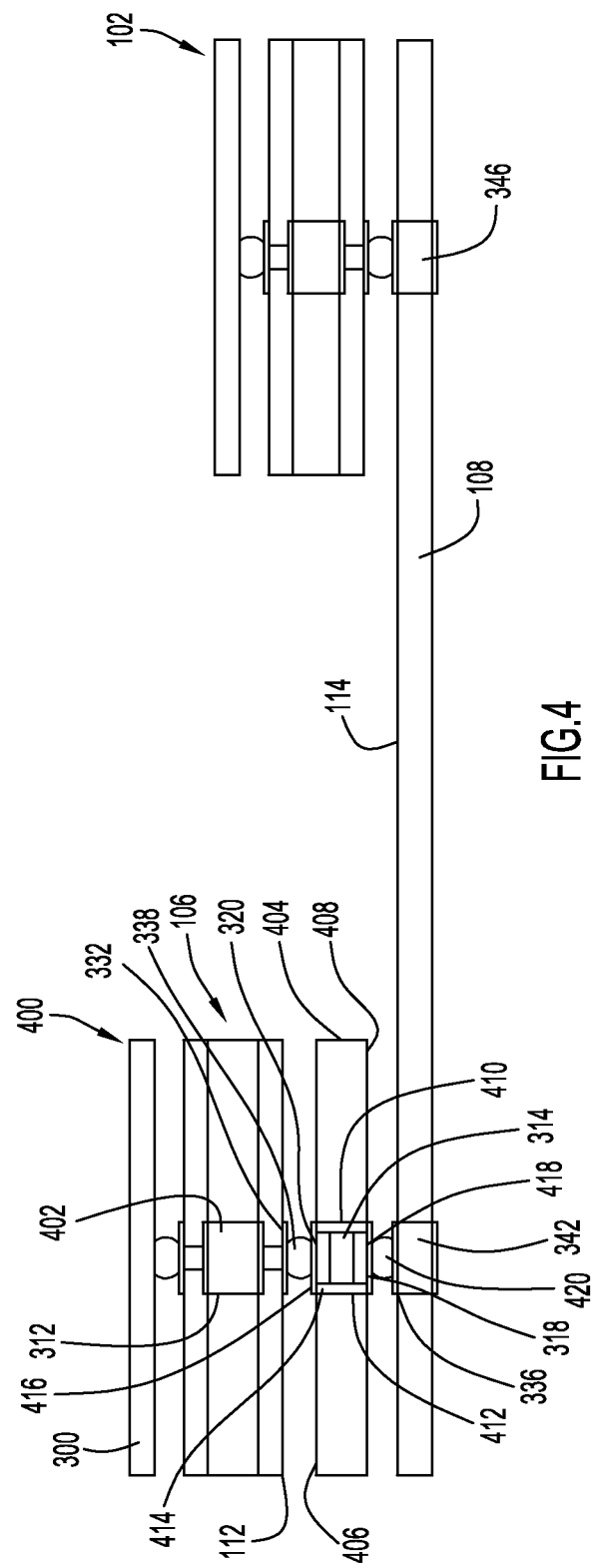
FIG. 4 is a cross-sectional view of an example embodiment of a computer system including two electrically connected semiconductor packages.

A cross-sectional view of another example embodiment of a system including two electrically connected semiconductor packages is shown in FIG. 4. The system includes a first semiconductor package 400 and the second semiconductor package 102 of FIGS. 1-3. The first semiconductor package 400 includes the substrate 106 that supports and is electrically connected to the first semiconductor device 300. In the embodiment shown in FIG. 4, the DC blocking capacitors 314 are not disposed in the plurality of openings 312 in the substrate 106. The plurality of openings 312 are instead filled (e.g., plated) with an electrically conducting material 402 such as, for example, copper.

The substrate 106 is supported by an interposer 404, for example. The interposer 404 may be made of any number of dielectric materials including, for example, glass reinforced epoxy. The interposer 404 may include a first surface 406, a second surface 408 and surfaces 410 that at least partly define a plurality of openings 412 (one shown). Each opening 412 of the plurality may extend from the first surface 406 to the second surface 408 of the interposer 404 in a direction perpendicular, generally perpendicular or transverse to the first surface 406 and/or the second surface 408 of the interposer 404 (e.g., vertically). "Generally perpendicular" allows for other angles while still extending in a direction away from the first surface 406 and/or the second surface 408 of the interposer 404. In one embodiment, each opening 412 of the plurality of openings is larger at the first surface 408 than at the second surface 410. The interposer 404 may be any number of shapes including, for example, rectangular. The plurality of openings 412 may be cylindrical, for example.

A circuit element 314 (e.g., a DC blocking capacitor) may be disposed in each opening 412 of the plurality. The circuit element 314 may also be any other suitable type of electrical circuit element, such as a resistor or an inductor, for example. An opening 412 may be sized and shaped such that at least part of the DC blocking capacitor 314 abuts the surface 410 that at least partly defines the opening 412 (e.g., a semi-tight fit). The DC blocking capacitor 314 may be disposed in the opening 412 such that the input 318 of the DC blocking capacitor 314 is adjacent to the second surface 408 of the interposer 404, and the output 320 of the DC blocking capacitor 314 is adjacent to the first surface 406 of the interposer 404. In one embodiment, the DC blocking capacitor 314 is disposed in the opening 412 such that a longitudinal axis of the DC blocking capacitor 314 (e.g., extending from the input 318 to the output 320 of the DC blocking capacitor 314) is substantially parallel to the surface 410 that at least partly defines the opening 412. In other words, the longitudinal axis of the blocking capacitor 314 may extend substantially vertical between the first surface 406 and the second surface 408 of the interposer 404. In other embodiments, the DC blocking capacitor 314 may be in different orientations relative to the surface 410.

An electrically non-conductive material 414 (e.g., an epoxy) may be disposed in each opening 412 of the plurality to fix the orientation (e.g., vertical orientation) of the blocking capacitor 314 within the opening 412. The epoxy 414 may be disposed in the opening 412 such that the epoxy 414 at least partially surrounds the DC blocking capacitor 314. In one embodiment, the epoxy 414 may be applied (e.g., laminated) to the first surface 406 and the second surface 408 of the interposer 404 and allowed to flow into the plurality of openings 412. Openings (e.g., micro vias; not shown) may be formed (e.g., drilled) in the epoxy 414 disposed on the first surface 406 and the second surface 408 of the interposer 404, adjacent to the input 318 and the output 320 of the DC blocking capacitor 314. The micro vias in the epoxy 414 may be filled with any number of electrically conductive materials (e.g., an electrically conductive plating) including, for example, copper.

A first layer of electrically conductive material 416 may be disposed (e.g., plated) on or adjacent to the first surface 406 of the interposer 404, and a second layer of electrically conductive material 418 may be disposed (e.g., plated) on or adjacent to the second surface 408 of the interposer 404. The first layer of electrically conductive material 416 may abut or be adjacent to the output 320 of the DC blocking capacitor 314, and the second layer of electrically conductive material 418 may abut or be adjacent to the input 318 of the DC blocking capacitor 314. In one embodiment, the first layer of electrically conductive material 416 and the second layer of electrically conductive material 418 may be electrically connected to the output 320 and the input 318 of the DC blocking capacitor 314, respectively, through the plated micro vias in the epoxy 414. The first layer of conductive material 416 and the second layer of conductive material 418 may be any number of electrically conductive materials including, for example, copper or aluminum. The first layer of copper 416 and the second layer of copper 418 may be bonding pads, for example. The first layer of copper 416 and the second layer of copper 418 may be etched to form a circuit (e.g., traces).

Insulating layers may be disposed (e.g., laminated) on or adjacent to the first surface 406 and/or the second surface 408 of the interposer 404. The additional insulating layers may be any number of dielectric materials including, for example, glass reinforced epoxy. The insulating layers may be attached (e.g., laminated) to the interposer 404 and/or each other using an epoxy, for example. The insulating layers may include vias filled (e.g., plated) with the same or a different electrically conducting material than the first and second layers of electrically conducting material 416 and 418 (e.g., copper).

The interposer 404 may also include one or more additional layers of electrically conductive material (e.g., additional layers of copper) that abut or are adjacent to one or more of the insulating layers. The additional layers of copper may be etched to form additional circuits (e.g., traces) within or on the interposer 404.

The bonding pads 332 on the second surface 112 of the substrate 106 may be attached to the first layer of copper 416 (e.g., bonding pads) of the interposer 404 using the BGA 338 attached to the second surface 112 of the substrate 106, for example. The BGA 338 may be attached to the first layer of copper 416 of the interposer 404 using reflow soldering, for example. The BGA 338 may be used to conduct electrical signals from the interposer 404 to the substrate 106 of the first semiconductor package 100 and/or from the substrate 106 to the interposer 404 of the first semiconductor package 100.

The second layer of copper 418 (e.g., bonding pads) of the interposer 404 may be attached to the bonding pads 336 on the top surface 114 of the PCB 108 using an array of solder balls 420 (e.g., a ball grid array (BGA)) attached to the second layer of copper 418 of the interposer 404, for example. The BGA 420 may be attached to the bonding pads 336 on the top surface 114 of the PCB 108 using reflow soldering, for example. The BGA 420 may be used to conduct electrical signals from the PCB 108 to the interposer 404 of the first semiconductor package 100 and/or from the interposer 404 of the first semiconductor package 100 to the PCB 108.

In the embodiment shown in FIG. 4, the interposer 404 houses the DC blocking capacitors 314. In another embodiment, the first semiconductor package 400 does not include an interposer 404, and the DC blocking capacitors 314 are disposed in the first plurality of vias 342 or the second plurality of vias 346 in the PCB 108. The first plurality of vias 342, for example, may be filled with an electrically non-conductive material (e.g., an epoxy) to fix the orientation (e.g., vertical orientation) of the blocking capacitors 314 within the first plurality of vias 342. The epoxy may be disposed in the first plurality of vias 342 such that the epoxy at least partially surrounds the blocking capacitors 314.

Figure 5:
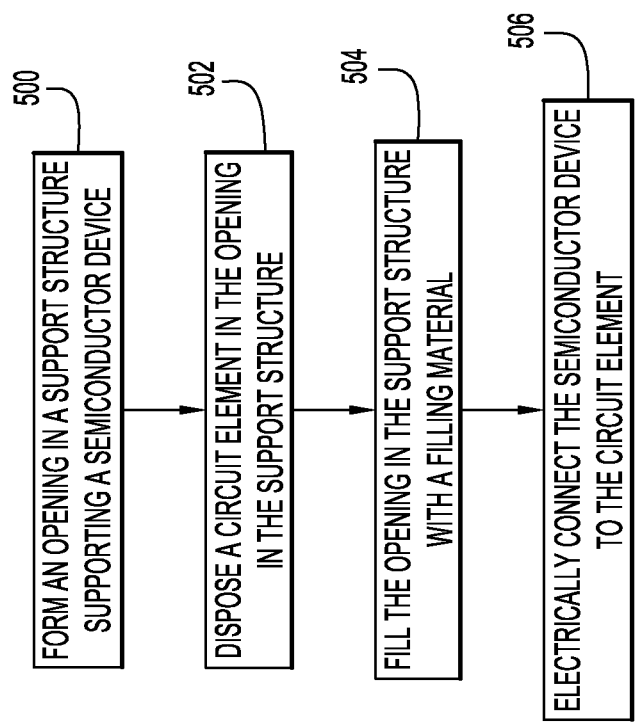
FIG. 5 is a flow chart of an example embodiment of manufacturing a semiconductor package.
Figure 6:
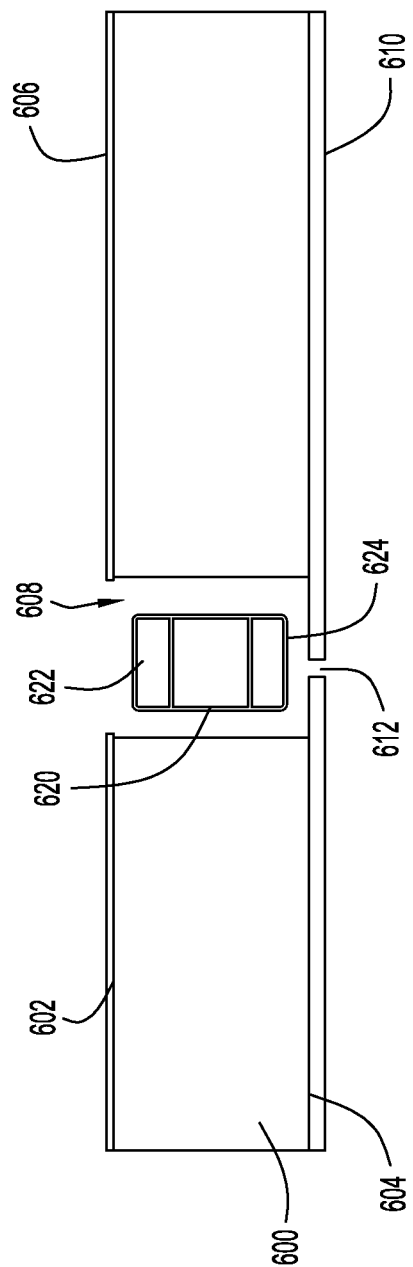
FIGS. 6-10 are a series of cross-sectional views of a support structure showing the manufacturing steps for forming a semiconductor package including an embedded circuit component in accordance with an example embodiment.

An example method of manufacturing a semiconductor package as depicted in FIGS. 1-4 is now generally described with reference to the flow chart of FIG. 5. The method is implemented in the order shown, but other orders may also be used. In addition, the method can also be achieved with different (e.g., additional, fewer or substituted) method steps.

At 500, an opening is formed in a support structure. The support structure is operable to support a semiconductor device. The opening may be created in any number of ways including, for example, with a drill or saw, by pressing, or by forming the support structure with the opening. The opening may be formed using control depth drilling. A single drill bit or a plurality of drill bits having different diameters may be used. In one embodiment, more than one opening is formed in the support structure. The one or more openings may extend at least partly between a first surface (e.g., a top surface) of the support structure and a second surface (e.g., a bottom surface) of the support structure. In one embodiment, the one or more openings extend from a first surface (e.g., a top surface) of a core layer of the support structure to a second surface (e.g., a bottom surface) of the core layer. Where an opening extends partly between the first surface and the second surface, for example there is an opening at the first surface but not at the second surface, a platform may be formed at the second surface on which the circuit element, such as the DC blocking capacitor, may be disposed. Alternatively or in addition, where the opening extends partly between the first surface and the second surface, a hole, such as a vent hole, may extend through the platform. The one or more openings may extend in a direction generally perpendicular to the top surface of the support structure, the bottom surface of the support structure, the top surface of the core layer, and/or the bottom surface of the core layer (e.g., vertically). Alternatively, the one or more openings may extend in a direction that is at an angle less than or greater than ninety degrees to the first surface and/or the second surface of the core layer. In one embodiment, each opening of the one or more openings may be larger at the first surface than the second surface. The support structure may be initially plugged and laser drilling may be used to form the one or more openings. The opening at the second surface may be smaller than a width of the circuit element. The smaller size of the opening at the second surface may prevent the circuit element from falling out of or passing through the support structure when placed in the support structure through the opening at the first surface. The support structure may be a substrate, an interposer or a printed circuit board (PCB), for example. The support structure may be a bismaleimide triazine-based (BT-based) substrate, for example. The plurality of openings may be any number of shapes including, for example, conical or cylindrical.

A first portion of the one or more openings may be filled (e.g., plated) with an electrically conducting material such as, for example, copper, and a second portion of the one or more openings may not be plated (e.g., unplated openings) with the electrically conducting material. The first portion of the one or more openings may be plated using electroplating or electroless plating, for example. The unplated openings may be filled with a dry film, for example, to prevent the unplated openings from being filled with the electrically conducting material during the plating process.

At 502, a circuit element is disposed in the one of the openings in the support structure. The circuit element may be disposed through some or all of the openings in the support structure. The openings may be shaped and sized such that at least part of the circuit element abuts a surface at least partly defining one of openings in the support structure. In one embodiment, the minimum diameter of the opening is approximately equal to a diameter of circuit element to fixedly maintain the circuit element in the opening using, for example, friction fit, snap fit, wedging, or any other form of coupling mechanism to maintain the circuit element disposed in the opening. The circuit element may be a direct current (DC) blocking capacitor. In other embodiments, the circuit element may be a resistor or an inductor, for example.

The circuit element may be disposed in the opening in the support structure such that a longitudinal axis extending between an input and an output of the circuit element is generally parallel to a surface at least partly defining the opening in the support structure and/or generally perpendicular to the top surface of the support structure and/or the bottom surface of the support structure. The circuit element may be disposed in the opening in the support structure such that the surface at least partly defining the opening in the support structure at least partly surrounds the circuit element (e.g., an end of the circuit element may be above the top surface of the core layer or below the bottom surface of the core layer). In one embodiment, the circuit element may be disposed in the opening in the substrate such that the longitudinal axis of the circuit element is vertical.

In one embodiment, the diameter of the opening in the support structure may be greater than the diameter of the circuit element. A film layer (e.g., a pressure/heat sensitive film) may be positioned over the opening and attached to the bottom surface of the support structure with pressure, heat and/or an adhesive, for example, such that the circuit element remains in the opening. The film layer may include a hole (e.g., a vent hole). The opening in the film layer may be concentric with the opening. The film layer may be made of any number of materials including, for example, an epoxy and/or an elastomer.

At 504, the opening in the support structure is filled with a filling material (e.g., a paste). The filling material may be an electrically non-conducting material such as, for example, an epoxy. Other adhesives, for example, may be used as the filling material. The opening in the support structure may be filled with the filling material such that the circuit element is at least partly surrounded by the filling material. The filling material may act to fix the orientation (e.g., vertical orientation) of the circuit element within the opening in the support structure. In one embodiment, a layer of epoxy may be applied (e.g., laminated) to the top surface and/or the bottom surface of the core layer of the support structure. The epoxy may be allowed to flow into the opening (or plurality of openings) such that the epoxy at least partly surrounds the circuit element. Screen printing or screen printing under vacuum may be used to fill the opening in the support structure, for example. Some of the filling material may flow through the vent hole. The filling material may be dried and cured, and support structure may be planarized such that the film layer is removed.

At 506, the semiconductor device is electrically connected to the circuit element. Openings (e.g., micro vias) may be formed (e.g., drilled) in the filling material in the opening, adjacent to the input and the output of the circuit element. The micro vias in the layers of epoxy may be filled with any number of electrically conductive materials (e.g., an electrically conductive plating) including, for example, copper.

One or more layers of electrically conductive material (e.g., copper or aluminum) may be disposed (e.g., plated) on or adjacent to the top surface and/or the bottom surface of the core layer of the support structure. The one or more layers of electrically conductive material may be etched to form a circuit (e.g., traces). The one or more layers of electrically conductive material may be disposed on or adjacent to the top surface and/or the bottom surface of the core layer of the support structure before or after the opening is formed in the support structure.

Insulating layers may be disposed (e.g., laminated) on or adjacent to the top surface and/or the bottom surface of the core layer of the support structure. The insulating layers may be any number of dielectric materials including, for example, Ajinomoto Build-Up Film (ABF) or pre-impregnated composite fibers ("pre-preg"). The insulating layers may be attached (e.g., laminated) to the core layer and/or each other using an epoxy, for example. Vias may be formed (e.g., drilled) in the insulating layers, and the vias in the insulating layers may be filled (e.g., plated) with the same or a different electrically conducting material than the one or more layers of electrically conductive material (e.g., copper).

One or more additional layers of electrically conductive material (e.g., additional layers of copper) may be disposed (e.g., via electroless plating or electroplating) on or adjacent to at least one insulating layer. The additional layers of copper may be etched to form additional circuits (e.g., traces) within or on the support structure.

Bonding pads may be disposed (e.g., plated) on or adjacent to the top surface of the support structure and the bottom surface of the support structure, such that the bonding pads abut or are adjacent to the copper plated vias in the insulating layers or the input and the output of the circuit element. The bonding pads may be made of a different or the same electrically conducting material as the plating of the vias in the insulating layers (e.g., aluminum or copper). The bonding pads may be formed as a single piece with the plating of the vias in the insulating layers. The bonding pads may be deposited using electroplating or electroless plating, for example. The bonding pads may also be adhered to the plating of the vias in the insulating layers with solder, for example.

The bonding pads on the top surface of the support structure may be attached to bonding pads on the substrate or bonding pads on the semiconductor device (e.g., depending on whether the support structure is the PCB, the interposer or the substrate) using an array of solder balls (e.g., a ball grid array (BGA)) attached to the bonding pads on the substrate or the bonding pads on the semiconductor device. The BGA may be attached to the bonding pads on the top surface of the support structure using reflow soldering, for example, to electrically connect the support structure and the semiconductor device.

Some example embodiments that utilize the methods as described above and depicted in the flow chart of FIG. 5 are now described with reference to FIGS. 6-18.

In a first example embodiment, a method for forming a semiconductor circuit package in which a circuit element is disposed within an opening or cavity in a support structure for the package is illustrated in FIGS. 6-10. Initially, a support structure 600, which may serve as a supporting substrate for a semiconductor package or as a printed circuit board (PCB), is provided with a first surface 602 and a second surface 604 that opposes the first surface 602. As with the previous embodiments, the support structure 600 can comprise an organic substrate (e.g., the substrate can be made from a polymeric material such as a BT-based material) and/or other types of insulated metal or ceramic materials. A metal layer 606 (e.g., copper or any other suitable electrically conductive material) is applied to the first surface 602 in any suitable manner (e.g., electroplating or electroless plating).

A via or cavity 608 is formed within the support structure 600 that extends to each of the first and second surfaces 602, 604 and also through the metal layer disposed on the first surface 602. The cavity 608 can be formed in any suitable manner within the support structure 600 such that it extends transversely (e.g., perpendicular or non-perpendicular) in relation to the first and second surfaces 602, 604. For example, the cavity 608 can be formed by drilling (e.g., laser drilling), by an etching process, or any combination of the two techniques. The cavity can have any suitable cross-sectional shape (e.g., round or circular, oval, square or rectangular, multi-faceted, irregular-shaped, etc.). In addition, the cavity 608 can be formed prior to formation of the metal layer 606 to the support structure 600 (where the metal layer 606 is then formed on the first surface 602 by selective plating such that the cavity 608 remains open at the first surface 602) or subsequent to formation of the metal layer 606 on the support structure 600.

A film layer 610, such as a pressure and/or heat sensitive film (e.g., an epoxy, an elastomer, etc.) is applied (e.g., via an adhesive or any other suitable application) to the second surface 604 of the support structure 600. Optionally, a perforation or vent 612 can be formed within the film layer 610 at a location that is concentric with the support structure cavity 608, where the vent 612 is smaller in dimension than the diameter or cross-section of the cavity 608. As described below, the vent 612 facilitates flow of cavity plugging material to flow through the vent 612 during filling of the cavity 608.

An electrical circuit component 620, such as a DC blocking capacitor, a resistor, an inductor, or any other type of electrical circuit element, is placed within the cavity 608. The circuit component 620 may be disposed in the cavity 608 such that its first and second ends 622, 624 generally extend toward the first and second surfaces 602, 604 of the support structure 600, where electrical signals may flow within the component 620 between its first and second ends 622, 624. In the embodiment shown in FIG. 6, the circuit component 620 is aligned such that its longitudinal or lengthwise dimension is generally perpendicular with the first and second surfaces 602, 604 of the support structure 600. However, the component 620 can also be inserted and situated within the cavity 608 so as to extend transversely but not perpendicularly with respect to the first and second surfaces 602, 604 of the support structure 600. The film layer 610 maintains the component 620 within the cavity 608 (i.e., the component 620 is prevented from falling through the second surface 604, when the support structure 600 is aligned with first surface 602 above second surface 604, due to the film layer 610 providing a barrier to exit for the component 620).

Figure 7:
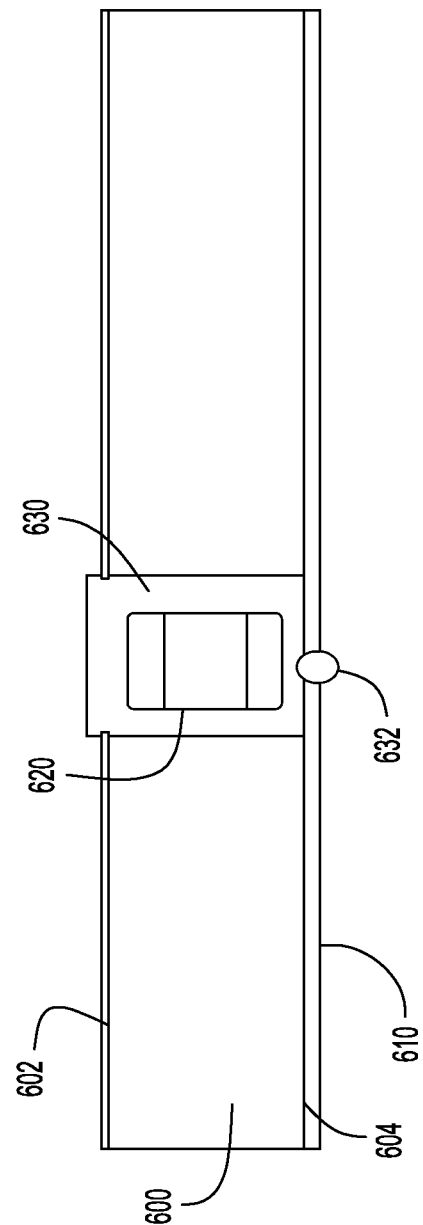

After the circuit component 620 has been placed within the cavity 608, the cavity 608 is filled with a filling material 630 (e.g., a paste) as shown in FIG. 7. The filling material can be any electrically non-conducting material such as, for example, an epoxy. Alternatively, other materials, such as adhesives, can be used as the filling material. The cavity 608 can be filled with the filling material such that the circuit component 620 is at least partly surrounded by the filling material. The filling material may act to fix the orientation (e.g., vertical orientation, tilted orientation, etc.) of the circuit component 620 within the cavity 608 of the support structure 600. The filling of the cavity 608 with filling material 630 can be achieved in any suitable manner. For example, filling can occur by screen printing, or screen printing under vacuum. As the filling material 630 flows within the cavity 608 around portions of the circuit component 620 (e.g., from the first surface 602 to the second surface 604), it can fill and form a plugging residue 632 at the vent 612. The filling material 630 is dried and cured in any suitable manner so as to become a suitably rigid supporting material for the component 620 within the cavity 608 of the support structure 600.

Figure 8:
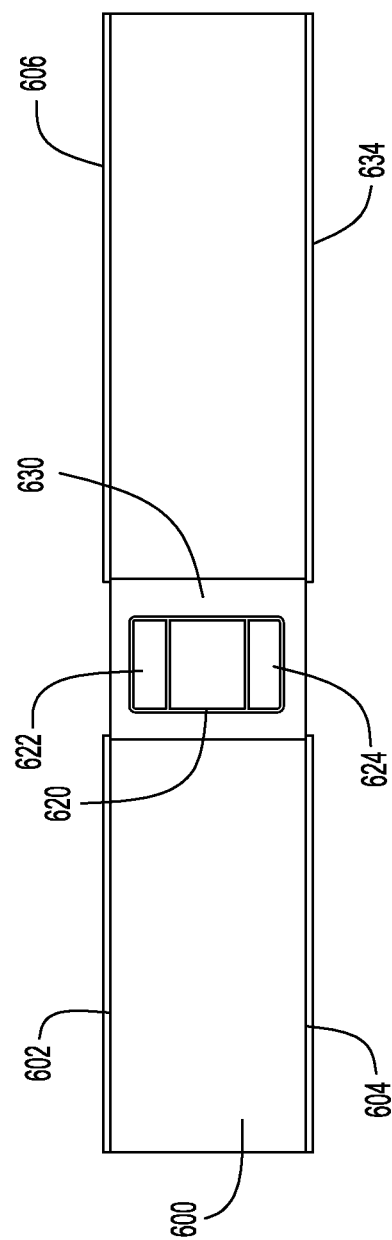

The film layer 610 and excess filling material 630 disposed outside of the cavity 608 at either side 602, 604 of the support structure 600 is removed (e.g., by planarizing and/or polishing, or in any other suitable manner). After removal of the film layer 610, a second metal layer 634 (e.g., copper or any other suitable electrically conductive material) is applied to the second surface 604 (e.g., via an electroplating or electroless plating process), where the second metal layer 634 does not cover the cavity 608. The resultant structure 600, as shown in FIG. 8, includes the circuit component 620 embedded within the filled cavity 608 of the structure 600, where the ends 622, 624 of the component 620 can be configured as conductive terminals for the embedded component 620. The length dimension of the circuit component 620 and the thickness of the support structure 600 can be configured such that each of the ends 622, 624 of the circuit component 620 are a selected distance (e.g., from 0 micrometer or micron to about 75 microns) from a corresponding side 602, 604 of the structure 600.

Figure 9:
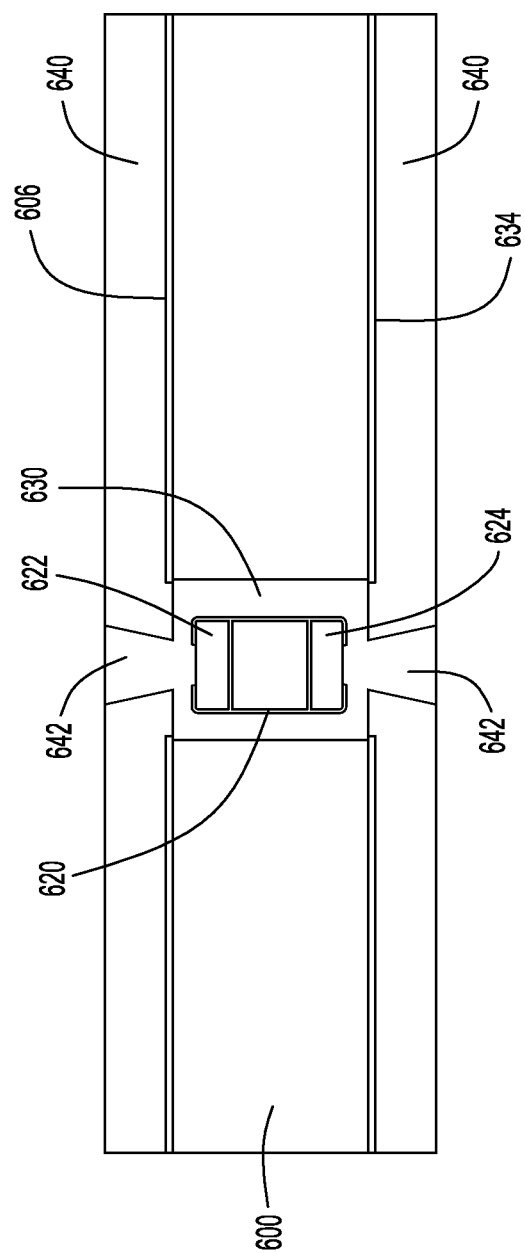

An electrical connection can be achieved for the circuit component 620 by first applying a build-up layer 640 over each of the metal layers 606, 634 and corresponding first and second surfaces 602, 604 of the structure 600, as shown in FIG. 9. The build-up layer can comprise any suitable insulating material or dielectric material including, without limitation, Ajinomoto Bond Film (ABF) (e.g., for package substrates) or pre-impregnated composite fibers (also referred to as "prepreg") (e.g., for PCB substrates). The build-up layers 640 can be applied in any suitable manner to the opposing sides of the structure 600 (e.g., via lamination and/or utilizing an adhesive such as epoxy, etc.). The build-up layers on each side of the structure 600 can have the same or substantially similar thickness or, alternatively, different thicknesses. The thickness of each build-up layer can be in the range from about 25 microns to about 100 microns.

Micro-openings or vias 642 are formed within each build-up layer 640 and through a portion of the filling material 630 on each side of the structure 600 (e.g., utilizing a laser drilling process) so as to expose a portion of the conductive terminal ends 622, 624 of the circuit component 620. As shown in FIG. 9, the micro vias 642 have a tapered cross-sectional configuration, where the via walls taper so as to form a reduced cross-sectional dimension in a direction from a surface 602, 604 of the structure 600 toward an end 622, 624 of the component 620. However, the vias can be formed of any suitable cross-sectional shape or dimension that facilitates exposure of some surface area portion of each end 622, 624 of the component 620.

Figure 10:
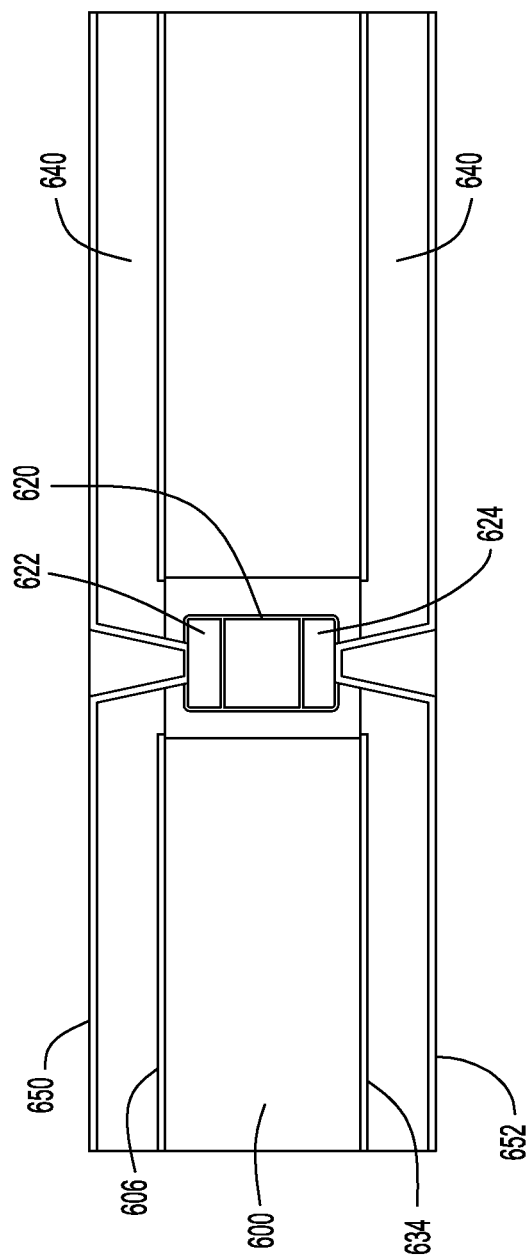

Referring to FIG. 10, another metal layer (e.g., copper or any other suitable electrically conductive material) is applied (e.g., via electroplating or electroless plating) to the exposed surfaces of the build-up layers 640, to the tapered walls of the micro vias 642 and also to the exposed portions of the conductive terminal ends 622, 624 of the circuit component 620. This metallization of the structure 600 results in metal layer electrical connections 606 and 634 as well as metal layer electrical connections 650 and 652 that extend between the embedded conductive terminal ends 622 and 624 of the circuit component 620 and other circuit components (e.g., components in a multi-layered circuit, such as any of the previously described structures as depicted in FIGS. 1-4).

Figure 11:
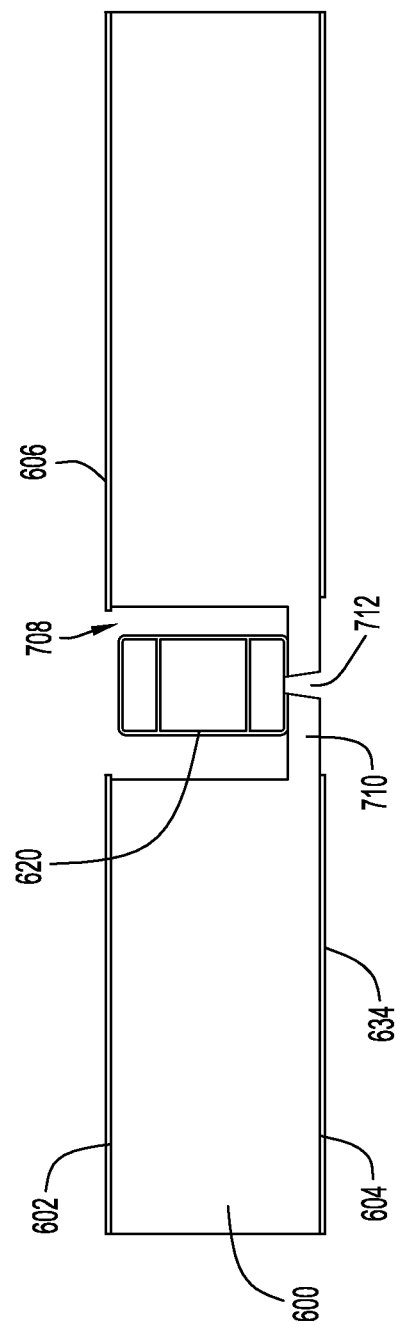
FIGS. 11 and 12 are a series of cross-sectional views of a support structure showing the manufacturing steps for forming a semiconductor package including an embedded circuit component in accordance with another example embodiment.
Figure 12:
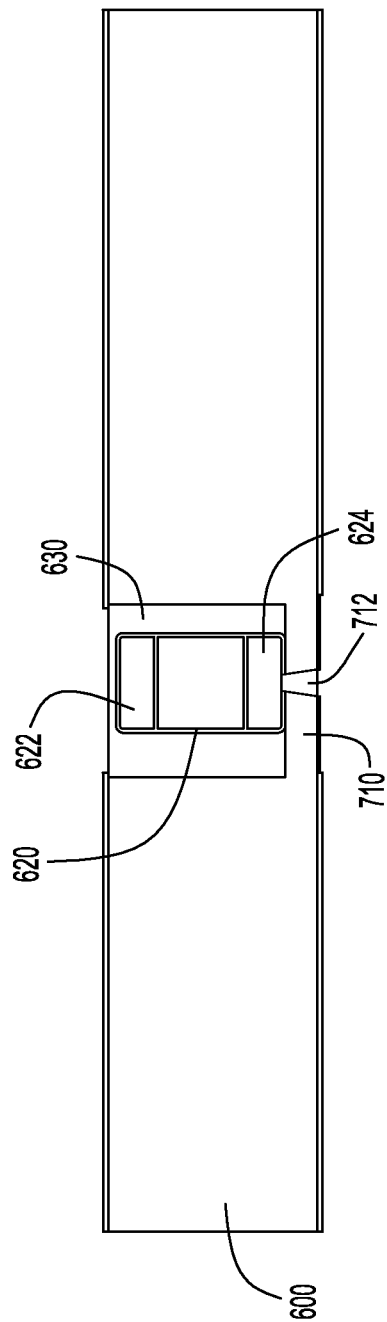

In another example embodiment depicted in FIGS. 11 and 12, a via or cavity can be formed within the support structure that has varying cross-sectional dimensions which provide a supporting ledge or platform for the circuit component that is placed within the cavity. For example, a cavity can be formed utilizing a drilling process referred to as a Control Depth Drill to customize the cavity so as to be only partially formed within (e.g., not extending entirely through) the support structure or forming the cavity utilizing variable drill sizes (so as to modify the cross-sectional dimensions of the cavity as it extends through the support structure).

Referring to FIG. 11, a cavity 708 is partially formed (e.g., by drilling with a Control Depth Drill) within the support structure 600. In particular, the cavity 708 is formed at the first surface 602 of the support structure 600, extending from the first surface 602 to an interior portion of the structure 600 but without extending to the second surface 604. Thus, a ledge or platform 710 is defined within the support structure 600 at location where the cavity 708 ends. The platform 710 provides a support for the circuit component 640 to be embedded within the structure 600. A vent 712 is provided within the platform 710 (e.g., utilizing a drill size having a smaller diameter dimension in relation to the drill size for forming the cavity 708) so as to extend from the cavity 708 to the second surface 604 of the support structure 600. As shown in FIG. 11, the vent 712 has a tapered cross-sectional configuration, with the diameter or cross-sectional dimension of the vent 712 decreasing within the platform 710 as it extends from the second surface 704 of the structure 600 to the cavity 708. However, it is noted that the vent 712 can be formed to have any other suitable cross-sectional configuration.

Metal layers 606 and 634 (e.g., copper or any other suitable electrically conductive material) are formed on the first and second surfaces 602 and 604 of the structure 600 in a manner similar to that which has been previously described for the embodiment of FIGS. 6-10. The surface metal layers 606, 634 can optionally be circuitized (e.g., forming metal layer patterns) utilizing any suitable formation techniques (e.g., by direct printing or etching). Further, one or both metal layers 606, 634 can be applied to the structure 600 prior to formation of the cavity 708 or vent 712. In such scenarios, the cavity 708 and vent 712 can be formed through the already applied layers 606, 634 (e.g., by drilling through such layers as well as structure 600) or, alternatively, the layers 606, 634 can be formed on portions of the first and second surfaces so as not to cover the surfaces at the location in which the cavity 708 is to be formed (e.g., preventing plating of such surface areas by tenting such surface areas with dry film or utilizing any other suitable techniques).

After formation of the cavity 708 with supporting platform 710, the circuit component 620 (e.g., DC blocking capacitor, resistor, inductor or any other suitable type of electrical circuit element) is placed within the cavity 708. In the embodiment of FIGS. 11 and 12, the cavity 708 is formed having a sufficient longitudinal dimension or depth such that the circuit component 620 is completely received within the cavity 708 (and thus completely embedded within the support structure 600) when it rests upon the platform 710.

After insertion of the circuit component 620 within the cavity 708, the cavity 708 is filled with a filling material 630 (e.g., a paste) as shown in FIG. 12. The filling material comprises an electrically non-conducting material (e.g., an epoxy) and can be filled within the cavity in any suitable manner, such as the types described above for the embodiment of FIGS. 6-10 (e.g., via screen printing, or screen printing under vacuum). The filling material at least partially surrounds the component 620 so as to secure it within the cavity 708 in any suitable or desired orientation (e.g., a vertical orientation in which the ends 622, 624 are generally perpendicular with support structure surfaces 602, 604, in a tilted orientation, etc.). As with the previous embodiment of FIGS. 6-10, the filling material can also fill the vent 712. The filling material 630 is dried and cured in any suitable manner so as to become a suitably rigid supporting material for the component 620 within the cavity 708 of the support structure 600. Excess fill material can be removed from the surfaces of the support structure 600 in any suitable manner (e.g., planarizing, polishing, etc.).

Formation of build-up layers 640 (e.g., ABF or prepreg materials) over the metal layers 606, 634, followed by the formation of micro vias within the build-up layers 640 so as to expose the conductive terminal ends 622, 624 of the circuit component 620, and the further formation of metal layers 650, 652 (e.g., copper or any other suitable electrically conductive material) on the exposed surfaces of the build-up layers 640 is achieved in the same or similar manner as described above for the previous embodiment as shown in FIG. 10. This results in the formation of metal layer electrical connections that extend between the embedded conductive terminal ends 622 and 624 of the circuit component 620 and other circuit components and the formation of a multi-layered circuit (e.g., the formation of any of the previously described structures as depicted in FIGS. 1-4).

Figure 13:
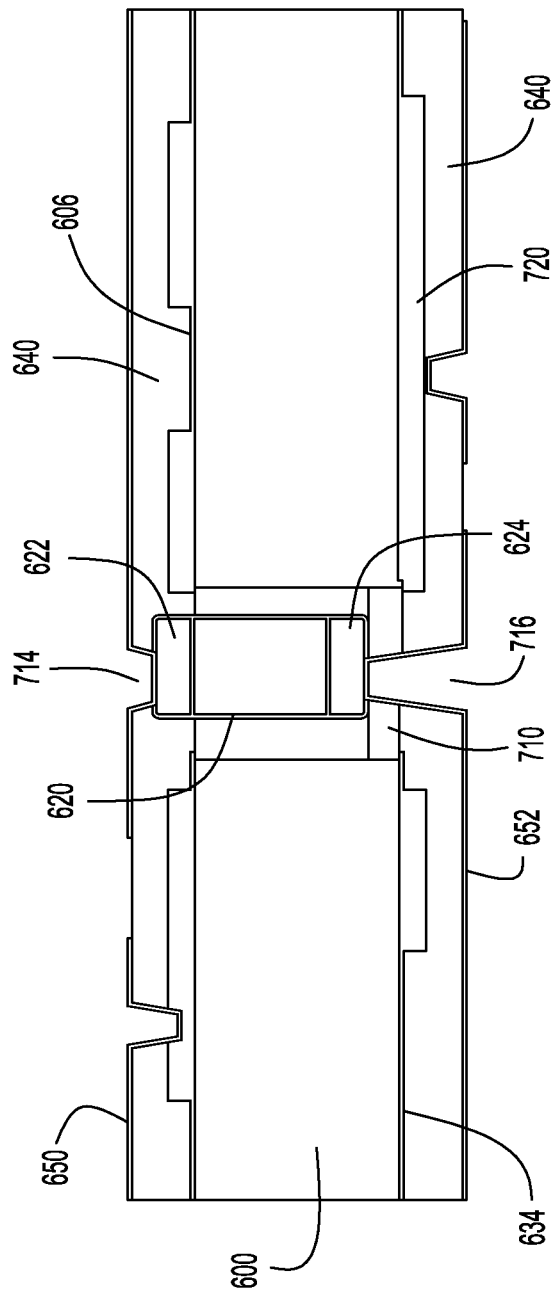
FIG. 13 is a cross-sectional view of a support structure showing a semiconductor package including an embedded circuit component formed in accordance with a further example embodiment.

An alternative embodiment of embedding a circuit component 620 within a support structure 600 is shown in FIG. 13. The method of forming the structure of FIG. 13 is similar to that of FIGS. 11 and 12, with the exception that the cavity 708 is formed within the structure 600 such that its longitudinal dimension or depth is less than the longitudinal dimension or depth of the component 620 to be inserted within the cavity 708. Thus, a conductive terminal end 622 of the circuit component 620 is not embedded within the structure 600 but instead extends from the cavity 708. However, the build-up layer 640 is formed to surround at least some of the conductive terminal end 622. Micro vias 714 and 716 are also formed within the build-up layers 640 to provide access to the conductive terminal ends 622, 624 so as to connect with metal layers 650 and 652, where the metal layers 650 and 652 provide metal layer connections that connect the terminal ends 622, 624 of the component 620 with other circuit components. For example, as shown in FIG. 13, other circuit components, such as component 720, are also connected with metal layers 650 and 652 or with metal layers 606 and 634. These circuit components can be formed in any suitable manner over metal layers 606, 634 prior to forming the build-up layers on the support structure 600.

As can be seen in FIG. 13, the micro via 714 associated with the first conductive terminal end 622 of the circuit component 620 can have a smaller longitudinal or lengthwise dimension or depth in relation to the micro via 716 associated with the second conductive terminal end 624 (since the end 622 of the component 620 extends from the cavity 708 while the build-up layers 640 have the same or similar thickness). The configuration of the structure can be configured such that the micro via 714 has a depth of at least about 10 micrometers (microns), while the depth of micro via 716 has a depth of no greater than about 50 microns.

Figure 14:
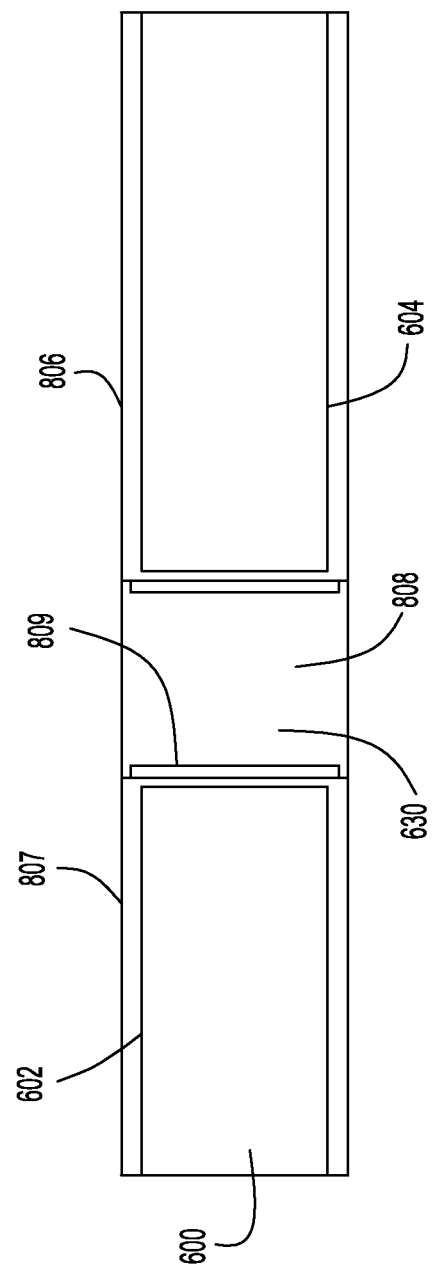
FIGS. 14-17 are a series of cross-sectional views of a support structure showing the manufacturing steps for forming a semiconductor package including an embedded circuit component in accordance with still another example embodiment.

In the embodiment depicted in FIGS. 14-17, a circuit component can be embedded within a cavity in any desired configuration, where the structure is also designed to have conductive side walls within the cavity in which the circuit component is embedded. Referring to FIG. 14, a cavity 808 is initially formed in the support structure 600. As with the previous embodiments, the cavity can be formed in any suitable manner (e.g., laser drilling, etching, utilizing a hole punching technique, etc.). Metal layer 806 and 807 can then be applied to the support structure utilizing any suitable technique (e.g., electroplating or electro less plating), where the metal layer 806 can also optionally be circuitized (i.e., forming a circuit of conductive pathways on one or both surfaces 602 and 604 of the support structure 600, where circuitization of the metal layers 806, 807 is shown to occur in the processing from FIG. 14 to FIG. 15) in any suitable manner (e.g., utilizing etching and/or printing techniques). In addition, one or more metal layers are also applied to some or all of the circumferential or cross-sectional side wall portions of the cavity 808 (i.e., portions 809 as shown in FIG. 14) and extending the entire longitudinal or lengthwise dimension of the cavity 808 so as to define each metal layer 806, 807 as a continuous metal layer that extends from a portion of the first surface 602 of the support structure 600 to a portion of the second surface 604 of the structure 600. The metal layers 806 and 807 can connect with each other within the cavity 808 via the cavity wall portions 809 (depending upon how much of the cavity wall portions are plated) or, alternatively, be maintained separate (i.e., not connected with each other) within the cavity 808 so as to maintain each metal layer 806, 807 as a separate electrical circuit path.

Figure 15:
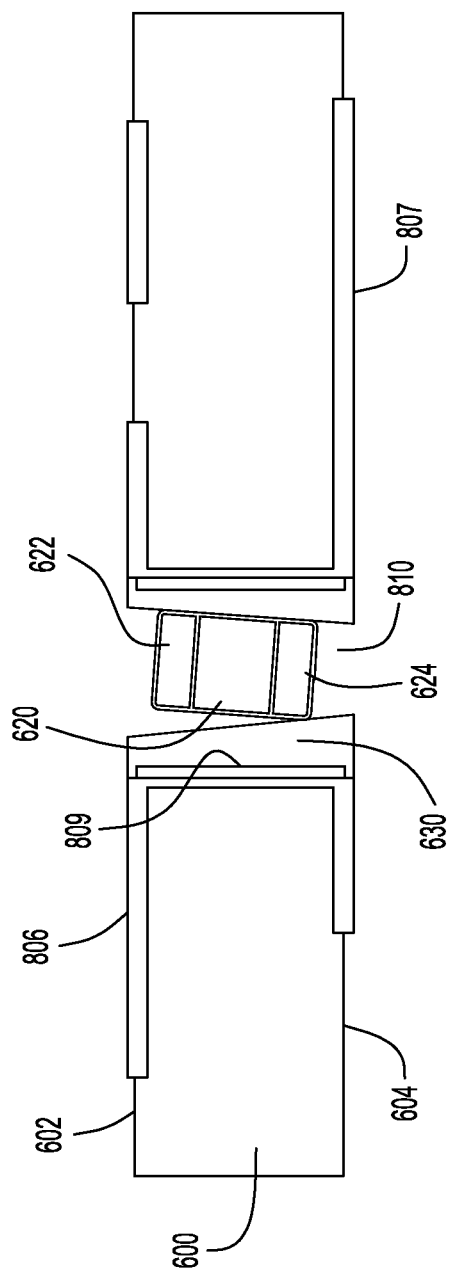

A fill material 630 (e.g., the same or similar type as described for the previous embodiments) is filled within the cavity 808 in any suitable manner (e.g., by screen printing with or without a vacuum), dried (e.g., to cure the fill material), and then excess fill material is removed from the sides of the structure 600 by any suitable process (e.g., planarizing and/or polishing). As shown in FIG. 15, a second cavity 810 is formed within the fill material 630 utilizing any suitable method (e.g., drilling, etching, hole punching, etc.). In an example embodiment, the cavity 810 is formed utilizing laser drilling techniques, so as to form a tapered cross-sectional configuration or shape (e.g., a conical or trapezoidal shape), where the sidewalls of the cavity 810 taper (i.e., the cross-sectional dimension of the cavity 810 decreases) from the first surface 602 to the second surface 604 of the support structure 600 (e.g., the laser drilling is initiated at the first surface 602).

The cavity 810 is further suitably dimensioned such that its greatest cross-sectional dimension is greater than the cross-sectional (e.g., width) dimension of the circuit component 620 while its smallest cross-sectional dimension is smaller than the cross-sectional dimension of the circuit component 620 (as shown in FIG. 15). In this configuration, the cavity 810 serves as a wedge to prevent the circuit component 620 from falling through the cavity 810 when it is placed therein and to further align the component 620 in a desired orientation within the cavity 810. For example, as shown in FIG. 15, after insertion of the component 620 within the cavity 810, the component 620 is aligned in a tilted configuration such that its longitudinal or lengthwise dimension is transverse but not perpendicular to (i.e., less than or greater than 90°) the surfaces 602 and 604 of the support structure 600. It is noted that the cavity 810 can be formed to have any suitable configuration that facilitates placement and setting of the circuit component 620 at any desired configuration with respect to the support structure. In addition, the circuit component 620 (including its conductive terminal ends 622, 624) is suitably aligned within the cavity 810 so as to be separated a sufficient distance from the conductive metal portions 809 formed along wall portions of the first cavity 808.

Figure 16:
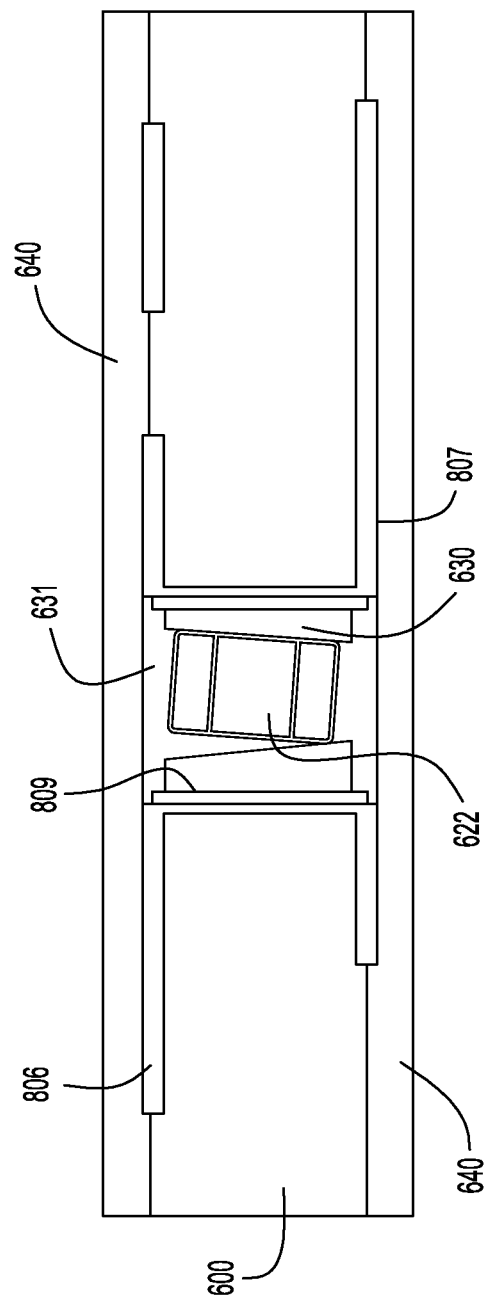

After placement of the component 620 within the cavity 810, the cavity 810 is filled with further fill material 631 as shown in FIG. 16. The fill material 631 can be the same or similar fill material as fill material 630. Alternatively, the fill material 631 can be formed as the same material as the build-up layers 640, as described below. In the scenario in which the fill material 631 is the same or similar material as fill material 630, the fill material 631 can be applied and dried (e.g., to cure the fill material) in the same manner as processing of the fill material 630. The drying/curing of the fill material 631 sets the component 620 in its embedded position within the support structure 600. Excess fill material 631 can then be removed from the opposing sides of the structure 600 (e.g., by planarizing and/or polishing).

Build-up layers 640 are applied to the opposing sides of the structure 600, where the build-up layers can comprise any of the previously described build-up materials and be applied in the same or similar manner as described for the previous embodiments. In the scenario in which the fill material 631 which secures the component 620 within the support structure 600 is formed as part of the build-up layers 640, application of the build-up layers on either side of the support structure 600 includes filling of the gaps within cavity 810 which are not occupied by the component 620 (thus encapsulating the component 620 therein).

Figure 17:
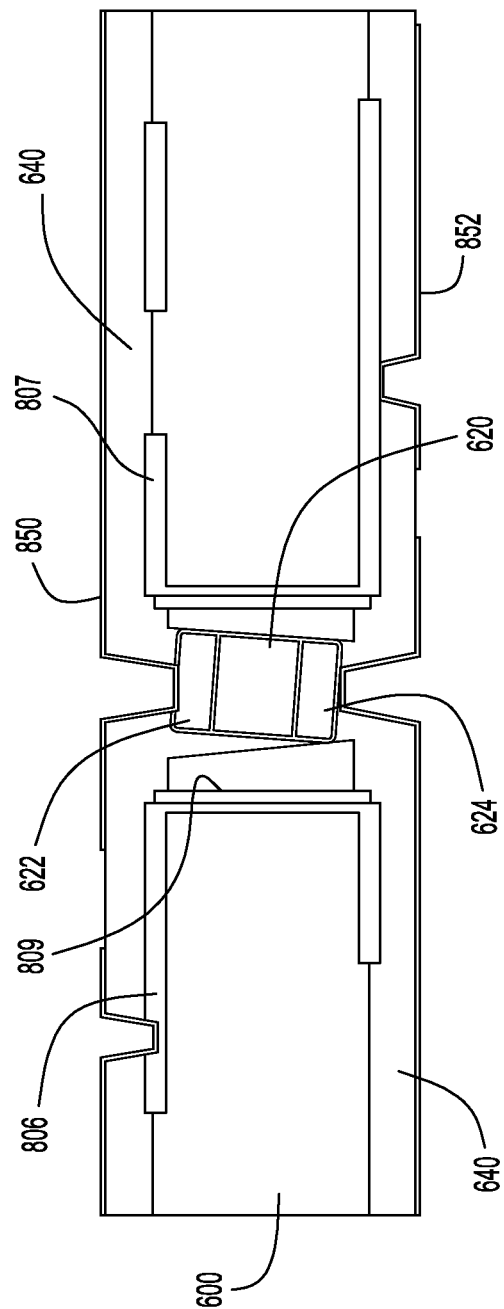

As shown in FIG. 17, micro vias can be formed within the build-up layers at various locations in a manner similar to that described for previous embodiments, including micro vias that extend to the conductive terminal ends 622, 624 of the circuit component 620. The micro vias can have the same or different general longitudinal or depth dimensions (e.g., depending upon the thicknesses of the build-up layers 640 and/or the depth of each end 622, 624 from an exposed surface of each build-up layer 640). In particular, micro vias are formed that extend from exposed surface portions of the build-up layers 640 on each side of the structure 600 into the cavity 810 and to a corresponding conductive terminal end 622, 624 of the component 620.

As shown in FIG. 17, metal layers 850 and 852 (e.g., copper or any other suitable electrically conductive material) are formed over the exposed surface portions of the build-up layers 640 in the same or similar manner as described above for the previous embodiments (e.g., by electroplating or electroless plating) so as to form electrically conductive pathways from the conductive terminal ends 622 and 624 of the embedded circuit component 620 to other circuit components associated with the support structure 600. In addition, as also shown in FIG. 17, certain micro vias also connect portions of each metal layer 850, 852 to a corresponding portion of metal layer 806 or 807.

The embodiment of FIGS. 14-17 provides at least the following additional features in relation to the previous embodiments of FIGS. 6-13: (1) a conductive cavity within the support structure and within which the circuit component is embedded, which can be designed to allow for simultaneous current flow and AC coupling (or resistance/decoupling, depending upon the type and functionality of the circuit component that is embedded within the support structure), thus providing both a space for an embedded circuit component and a conductive pathway for other circuit components of the device within a single cavity; (2) defining a tapered cavity (or other type of cavity that does not have a relatively constant or uniform cross-sectional dimension) within which to embed the circuit component, so as to facilitate different orientations of the circuit component within the support structure as well as to accommodate circuit components having different shapes and sizes; and (3) mitigation of z-axis CTE (coefficient of thermal expansion) mismatches between the circuit component and the support structure due to the additional spacing that can be provided between the two, which improves manufacturability and reliability of a device incorporating this structure as well as broadening the selection of different types of materials that can be used to form both the circuit component and support structure.

Figure 18:
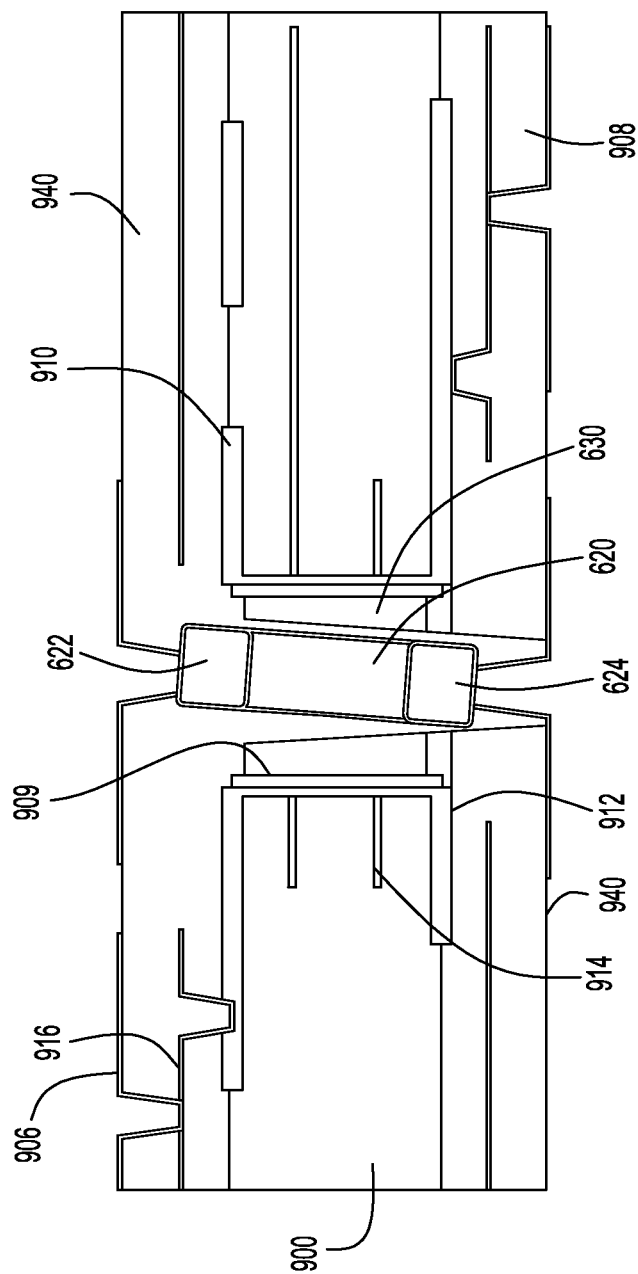
FIG. 18 is a cross-sectional view of a semiconductor package including an embedded circuit component formed in accordance with another example embodiment.

The embodiment of FIG. 18 utilizes a similar method to implant a circuit component within a support structure as that described above and depicted in FIGS. 14-17, with the exception that the structure includes a plurality of circuit layers in the support structure and also the build-up layers. In particular, a support structure 900 can be formed from a series of layers built up upon each other, so as to form metal layers (such as metal layer 914) embedded within the structure 900. The support structure can be formed of any suitable materials, such as those previously described for the support structure 600 of FIGS. 6-17. The embedding of the circuit component 620 within a cavity of the support structure 900 can be achieved in the same or substantially similar manner as that described for the embodiment of FIGS. 14-17, with the exception that the conductive terminal ends 622 and 624 of the component 620 extend from the support structure cavity. However, as shown in FIG. 18, these ends are embedded within one or more of the built-up layers 940.

A series of vertically stacked build-up layers (indicated generally as 940) can be formed in the same or substantially similar manner as those previously described for the embodiments of FIGS. 6-17, with the exception that metal layers (e.g., metal layer 916) are embedded within the build-up layers. The metal layers (which can comprise copper or any other suitable electrically conductive material) can also be formed on surfaces of any of the layers in the same or substantially similar manner as described for previous embodiments. For example, metal layers internal to the support structure 900 (e.g., metal layer 914) can be formed on an exposed surface of a portion or layer of the structure 900 prior to building another vertically stacked layer on this layer. Metal layers 910 and 912 can be formed on the outermost surface portions of the structure 900 prior to adding the build-on layers 940, and metal layers (e.g., metal layer 916) can be formed on the outer surface of one or more build-on layers 940 prior to the formation of the next layer on the previous layer. A series of micro vias are also formed at various locations along the build-up layers 940 to facilitate connections between outer metal layers 906 and 908 and the terminal ends 622 and 624 of the component 620 as well as with other metal circuit layers embedded within one or more build-up layers (e.g., a connection between outermost metal layer 906 of the build-on layers 940 and internal metal layer 916). The metal layers 910 and 912 can further extend through the cavity that embeds the circuit element 620 via metal plating 909 provided within the cavity walls.

Thus, the previously described embodiments provide useful manufacturing methods for embedding a circuit element or circuit component within a support structure (e.g., a PCB or other substrate) of a semiconductor package. This provides a number of benefits, particularly for embodiments in which the embedded components are DC blocking capacitors (e.g., for use in high-speed serial links). The components can be placed within pre-existing openings or vias within the support structure, which results in a higher density structure (i.e., no extra spaces or layers required for the component), and lower noise due to reduced signal reflection and crosstalk that would otherwise be caused by additional pads, vias, etc. that would be required for mounting the component on a surface of the support structure. The assembly of the semiconductor package with a circuit component embedded within a via of a support structure is relatively easy (as shown by the previous embodiments depicted in FIGS. 6-18), resulting in reduced and more efficient manufacturing costs.

The above description is intended by way of example only.

What is claimed is:

1. An apparatus comprising:
    a support structure including a first surface, a second surface opposing the first surface, and a cavity extending at least partially between the first and second surfaces;
    a semiconductor device supported by the support structure;
    a circuit element disposed in the cavity, the circuit element being electrically connected to the semiconductor device;
    an electrically non-conductive filling material disposed within the cavity so as to fill the cavity and at least partially surround the circuit element;
    a build-on layer disposed over the first surface or the second surface of the support structure including the cavity, the build-on layer comprising an insulating material or a dielectric material;

a via formed within the build-on layer that extends to at least a portion of a conductive terminal end of the circuit element;
a conductive material layer disposed over at least a portion of the build-on layer that extends within the via and contacts the conductive terminal end of the circuit element; and
a second conductive material layer disposed between the build-on layer and the first surface or the second surface of the support structure, wherein each of the conductive material layer and the second conductive material layer provides an electrical path between circuit components of the semiconductor device, and the second conductive material layer extends within side wall portions of the cavity in the support structure.

2. The apparatus of claim 1, wherein the circuit element is operable to substantially block direct current output by the semiconductor device or another semiconductor device.

3. The apparatus of claim 1, wherein the circuit element is disposed in the cavity in an orientation such that a longitudinal axis of the circuit element is substantially perpendicular to the first surface or the second surface of the support structure.

4. The apparatus of claim 1, wherein the cavity includes at least one tapered wall, and the circuit element is aligned within the cavity in an orientation such that a longitudinal axis of the circuit element is tilted within the cavity and non-perpendicular to the first surface or the second surface of the support structure.

5. The apparatus of claim 1, further comprising:
a platform disposed within the cavity to support the circuit element.

6. The apparatus of claim 5, wherein the platform includes an opening that extends through the platform to the second surface of the support structure.

7. The apparatus of claim 1, wherein the second conductive material layer provides an electrical path for circuit components that are not connected with the circuit element.

8. The apparatus of claim 1, further comprising:
an embedded conductive material layer within the support structure that provides an electrical path between circuit components of the semiconductor device.

9. The apparatus of claim 1, further comprising:
a plurality of build-on layers disposed in a vertically stacked manner upon the first surface or the second surface of the support structure; and
a third conductive material layer disposed between at least a first build-on layer and a second build-on layer vertically stacked on the first build-on layer, wherein the third conductive material layer provides an electrical path between circuit components of the semiconductor device.

10. The apparatus of claim 1, further comprising:
a first fill material disposed within the cavity, the first fill material including an opening formed within the first fill material that extends at least partially the longitudinal dimension of the first fill material, wherein the circuit element is disposed within the opening of the first fill material; and
a second fill material disposed within the opening of the first fill material that at least partially surrounds the circuit element.

11. An apparatus comprising:
a support structure including a first surface, a second surface opposing the first surface, and a cavity extending at least partially between the first and second surfaces;
a semiconductor device supported by the support structure;
a circuit element disposed in the cavity, the circuit element being electrically connected to the semiconductor device; and
an electrically non-conductive filling material disposed within the cavity so as to fill the cavity and at least partially surround the circuit element;
wherein the cavity includes at least one tapered wall, and the circuit element is aligned within the cavity in an orientation such that a longitudinal axis of the circuit element is tilted within the cavity and non-perpendicular to the first surface or the second surface of the support structure.

12. The apparatus of claim 11, wherein the circuit element is operable to substantially block direct current output by the semiconductor device or another semiconductor device.

13. The apparatus of claim 11, further comprising:
a platform disposed within the cavity to support the circuit element.

14. The apparatus of claim 13, wherein the platform includes an opening that extends through the platform to the second surface of the support structure.

15. The apparatus of claim 11, further comprising a conductive material layer formed over portions of the first surface or the second surface of the support structure, the conductive material layer further extending within side wall portions of the cavity in the support structure so as to provide an electrical path for circuit components of the apparatus that are not connected with the circuit element.

16. The apparatus of claim 15, further comprising:
a build-on layer disposed over the first surface or the second surface of the support structure including the filled cavity, the build-on layer comprising an insulating material or a dielectric material.

* * * * *